US008723186B2

(12) United States Patent
Tuller et al.

(10) Patent No.: US 8,723,186 B2
(45) Date of Patent: May 13, 2014

(54) IONIC JUNCTION FOR RADIATION DETECTORS

(75) Inventors: Harry L. Tuller, Wellesley, MA (US); Sean R. Bishop, Somerville, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 53 days.

(21) Appl. No.: 13/034,772

(22) Filed: Feb. 25, 2011

(65) Prior Publication Data

US 2012/0153295 A1    Jun. 21, 2012

Related U.S. Application Data

(60) Provisional application No. 61/348,779, filed on May 27, 2010.

(51) Int. Cl.
*H01L 29/15* (2006.01)
(52) U.S. Cl.
USPC .............................................. 257/76; 438/57
(58) Field of Classification Search
None
See application file for complete search history.

(56) References Cited

U.S. PATENT DOCUMENTS

| | | | |
|---|---|---|---|
| 7,157,716 B2* | 1/2007 | Kitaguchi et al. | ....... 250/370.12 |
| 2005/0056829 A1 | 3/2005 | Green et al. | |
| 2009/0179155 A1 | 7/2009 | Weinberg | |
| 2010/0314531 A1* | 12/2010 | Menge | ................... 250/214.1 |
| 2011/0248209 A1* | 10/2011 | Androulakis et al. | .......... 252/71 |

OTHER PUBLICATIONS

Yuri Dmitriev, Paul R. Bennett, Leonard J. Cirignano, Tapan K. Gupta, William M. Higgins, Kanai S. Shah, Philip Wong, Doping impact on the electro-optical properties of a TlBr crystal, Nuclear Instruments and Methods in Physics Research Section A: Accelerators, Spectrometers, Detectors and Associated Equipment, vol. 578, Issue 3, Aug. 11, 2007.*
Fernandes, R.Z.D et al., An Ionic Rectifying Contact. Solid State Ionic 34 (1989) 253-256. North-Holland.*
Owens A. et al., "Compound semiconductor radiation detectors", Nuclear Instruments & Methods in Physics Research. Section A: Accelerators, Spectrometers, Detectors, and Associated Equipment, vol. 631, No. 1-2, Sep. 21, 2004, pp. 18-37.
Dmitriev et al: "Doping impact on the electro-optical properties of a T1Br crystal", Nuclear Instruments & Methods in Physics Research. Section A: Accelerators, Spectrometers, Detectors, and associated equipment, vol. 578, No. 3, Jul. 27, 2007, pp. 510-514.

(Continued)

*Primary Examiner* — Mark Tornow
*Assistant Examiner* — Priya Rampersaud
(74) *Attorney, Agent, or Firm* — Sam Pasternack; MIT Technology Licensing Office

(57) ABSTRACT

Radiation detector. The detector includes an ionic junction having an ionically bonded wide band gap material having a first region dominated by positively charged ionic defects in intimate contact with a second region dominated by negatively charged ionic defects forming depleted regions on both sides of the junction resulting in a built-in electric field. The detector also includes an ionic junction having a first ionically bonded wide band gap material dominated by positively charged ionic defects in intimate contact with a second ionically bonded wide band gap material dominated by negatively charged ionic defects forming depleted regions on both sides of the junction resulting in a built-in electric field. Circuit means are provided to establish a voltage across the junction so that radiation impinging upon the junction will cause a current to flow in the circuit.

13 Claims, 1 Drawing Sheet

(56) References Cited

OTHER PUBLICATIONS

S.R. Bishop et al., "The Defect and Transport Properties of Donor Doped Single Crystil T1Br", Journal of the electrochemical society proceedings of the meeting of the electrochemical society, vol. 158, No. 2, Apr. 25, 2010, pp. J47-J51.

The International Search Report and Written Opinion issued in connection with International Patent Application No. PCT/US2011/036044 mailed on Jan. 27, 2012.

The International Search Report and Written Opinion Issued in Connection with International Patent Application No. PCT/US2011/036044 mailed on Dec. 6, 2012.

Owens A et al: "Compound semiconductor radiation detectors", Nuclear Instruments & Methods in Physics Research. Section A: Accelerators, Spectrometers, Detectors, and Associated Equipment, Elsevier BV North-Holland, Netherlands, vol. 531, No. 1-2, Sep. 21, 2004, pp. 18-37. XP004564741. ISSN: 0168-9002.

Dmitriev et al: "Doping impact on the electro-opticaJ properties of a IIBr crystal", Nuclear Instruments & Methods JN Physics Research. Section A: Accelerators, Spectrometers, Detectors, and Associated Equipment, Elsevier BV—North-Holland, Netherlands, vol. 576, No. 3; Jul. 27, 2007, pp. 510-514, XP022170224, ISSN: 0168-9002.

S.R. Bishop et al: "The Defect and Transport Properties of Donor Doped Single Crystal IIBr", Journal of the Electrochemical Society vol. 158, No. 2; Proceedings of the Meeting of the Electrochemical Society,Vancouver, Canada, Apr. 25-30, 2010, pp. J47-J51 , XP55016711 , ISSN: 0013-4651.

* cited by examiner

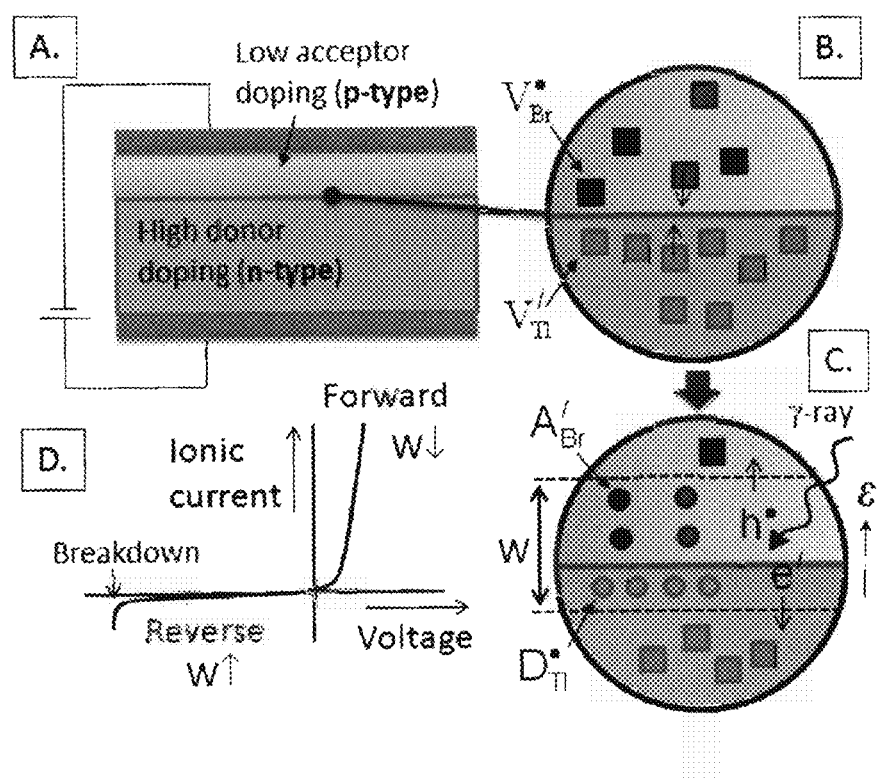

IONIC JUNCTION FOR RADIATION DETECTORS

This application claims priority to provisional application Ser. No. 61/348,779 filed May 27, 2010, the contents of which are incorporated herein by reference in their entirety.

This invention was made with Government support under Contract No. HSHQDC-07-C-00039, awarded by the Department of Homeland Security. The Government has certain rights in this invention.

BACKGROUND OF THE INVENTION

This invention relates to ionic junctions for use in radiation detectors, and more particularly to ionic junctions with greatly decreased ionic dark currents.

Radiation detectors based on thallium halides (e.g. TlBr) have in the past several years begun to live up to expectations and have demonstrated ever superior performance given their high stopping power (~280 g/mol mol. wt.), high dark resistivity ($E_g$~2.7 eV, $\rho$>$10^{10}$ $\Omega$cm), good resolution (2% at 662 keV), and increasingly high $\mu\tau$ products ($(\mu\tau)_e$>$2\times10^{-3}$ cm$^2$/V), the latter resulting from improvements in the growth of large high quality single crystals by vertical Bridgman and zone refining methods. However, due to the ionic nature of the dark conductivity, under high dc fields, one finds evidence for long term degradation due to electrochemical decomposition and/or large polarization at/near the electrodes resulting from the dark, ionic current.

We have previously developed a detailed predictive model which enables one to select dopants to maximize the dark resistivity as well as minimizing the contribution of the thallium ion to the dark current believed to control the degradation rate. Nevertheless, even with a room temperature resistivity of >$10^{10}$ ohm-cm, long term degradation due to electromigration of ions still remains a challenge.

SUMMARY OF THE INVENTION

In a first aspect, the invention is an ionic junction (analogous to a p-n junction in semiconductor technology) including an ionically bonded wide band gap material having a first region dominated by positively charged ionic defects in intimate contact with a second region dominated by negatively charged ionic defects forming depleted regions on both sides of the junction resulting in a built-in electric field. In a preferred embodiment, the material is thallium bromide (TlBr). In this embodiment, the first region is doped with an acceptor material which may be a thallium chalcogenide. The second region is doped with a donor material, such as lead bromide. A suitable material in addition to thallium bromide is a lead halide. Other suitable materials for use in the invention include thallium chloride and thallium iodide. In addition, other suitable materials include other metal halide ionic conductors such as cesium chloride, cesium bromide, cesium iodide, rubidium chloride, rubidium bromide, and rubidium chloride.

In another aspect, the ionic junction of the invention includes a first ionically bonded wide band gap semiconductor material dominated by positively charged ionic defects in intimate contact with a second ionically bonded wide band gap semiconductor material dominated by negatively charged ionic defects forming depleted regions on both sides of the junction resulting in a built-in electric field. In a preferred embodiment of this aspect of the invention the first material is acceptor doped thallium chloride and the second material is donor doped thallium bromide.

In yet another aspect, the invention is a radiation detector including an ionic junction having an ionically bonded wide band gap material having a first region dominated by positively charged ionic defects in intimate contact with a second region dominated by negatively charged ionic detects forming depleted regions on both sides of the junction resulting in a built-in electric field. A circuit is provided for establishing a voltage across the junction whereby radiation impinging upon the junction will cause a current to flow in the external circuit.

In yet another aspect, the invention is a method for making an ionic junction including doping a wide band gap material with an acceptor material to create positively charged ionic detects. A thin film of the material doped with a donor impurity to create negatively charged ionic defects is then grown on the acceptor doped material by liquid phase epitaxy to form a junction between the acceptor-doped material and the donor-doped material.

In yet another aspect, the invention is a method for making an ionic junction including doping a wide band gap material with a donor material to form a single crystal wafer and exposing the wafer to a vapor containing acceptor species that adsorb onto and then diffuse into the wafer to form an acceptor doped region near the surface.

Still another aspect of the invention is a method for making an ionic junction including doping a wide band gap material with a donor material to form a single crystal wafer and depositing a thin layer of wide band gap material containing acceptor species onto a surface of the wafer. In this embodiment, a suitable method for the depositing step uses physical or chemical vapor deposition.

Still another aspect of the invention is a method for making an ionic junction including doping a wide band gap material with a donor material to form a single crystal wafer and depositing a thin layer of material containing acceptor species onto a surface of the wafer. The wafer is heated to a temperature at which the acceptor species diffuses into the wafer at a desired diffusivity. In this embodiment, a suitable method for the depositing step uses physical or chemical vapor deposition.

In yet another aspect, the invention is a method for making an ionic junction including doping a wide band gap material with a donor material to form a single crystal wafer and ion-implanting acceptor species into a surface of the wafer. The wafer is then annealed at a high temperature to remove implantation damage.

Those of ordinary skill in the art will recognize that these methods can be reversed so that one begins with an acceptor-doped material after which a donor-doped layer is grown on it according to the various methods just described.

Those of ordinary skill in the art will recognize that any method used in the formation of semiconducting p-n junctions can be applied as well to the formation of ionic p-n junctions.

BRIEF DESCRIPTION OF THE DRAWING

FIGS. 1A-1D are schematic illustrations of the ionic junction and radiation detector disclosed herein.

DESCRIPTION OF THE PREFERRED EMBODIMENT

We propose a transformative solution which would apply to all ionically bonded wide band gap semiconductors such as the thallium and lead halides and would lead to orders of magnitude decreased ionic currents as well as potentially improved electronic µτ products. We disclose a novel ionic "p-n" type junction in which the "p" region is, e.g. in TlBr, dominated by positively charged Br vacancies ($V_{Br}$) and in which the "n" region is dominated by negatively charged. Tl vacancies ($V_{Tl}$) as shown in FIGS. 1A and 1B. In earlier studies, we already showed that Pb donors substituting on Tl sites are compensated by Tl vacancies and Se acceptors are compensated by Br vacancies. In a similar manner to a conventional p-n junction, the ionic junction will form as the Tl (Br) vacancies diffuse respectively into the acceptor (donor) doped regions thereby annihilating each other and setting up depleted regions on both sides of the junction as well as a built-in electric field ($\epsilon$) arising from the donor ($D_{Tl}$) and acceptor ($A_{Br}$) dopants which are no longer compensated electrically by Tl and Br vacancies, respectively, as shown in FIG. 1C. Analogous to the traditional p-n junction where the number of electrons in the n-type region is equal to the number of donors and the number of electrons in the p-type region is equal to the equilibrium constant for electron-hole generation (the np product) divided by the acceptor concentration, the internal field or built-in voltage ($V_{bi}$) is given by $$V_{bi} = \frac{kT}{q}\ln\left(\frac{[V'_{Tl}]_n}{[V'_{Tl}]_p}\right) = \frac{kT}{q}\ln\left(\frac{N_A N_D}{K_s}\right) \quad (1)$$

where the concentration of Tl vacancies in the n-type region, $[V_{Tl}^1]_n$, is equal to the donor concentration, $N_D$, and the concentration of Tl vacancies in the p-type region, $[V_{Tl}^1]_p$, is given by the Schottky equilibrium constant, $K_s$, divided by the acceptor concentration, $N_A$. k, T, and q are the Boltzmann constant, temperature, and elementary charge, respectively. For TlBr, $K_s$ at room temperature is small relative to $N_A N_D$ and so a significant internal field can arise that acts as a voltage barrier ($V_b$) to defect migration with an effective depletion width in the material (W). Application of a bias ($V_a$) modifies $V_b$ as $V_b = V_{bi} - V_a$ so that when $V_a$ is positive, the barrier is reduced and the material is forward biased resulting in a transport of charged defects as shown in FIG. 1D. However, reversing the bias increases the barrier and there is very little ion migration.

This design is not limited to a homojunction of n and p type doped TlBr but could be applied to any ionic conductor which can be appropriately doped such that one side of the junction is dominated by positively charged ionic defects and the other side by negatively charged ionic defects. Furthermore, this design is not limited only to homojunctions but could equally well be applied to a heterojunction between two different ionic conductors, for example, donor doped TlBr and acceptor doped TlCl. A potential advantage in utilizing a heterojunction is that the different crystal lattice parameters characteristic of the two materials which make up the junction may serve to impede dopant migration across the junction that may occur in highly biased ionic materials. Another potential advantage of the heterojunction is to, for example, select a donor doped material with a high relative barrier to Tl diffusion and an acceptor doped material with a high relative barrier to Br diffusion which will further impede majority carrier migration.

Several key implications regarding improved performance follow. First, as in conventional p-n junctions, the reverse bias current drops orders of magnitude below that expected based on the bulk resistivity of the p and n regions. First, this should serve to reduce the ionic dark current leading to a) higher sensitivity and b) reduced degradation due to reduced ionic electromigration. The latter should serve to extend the effective operating lifetime of such devices by orders of magnitude. Second, the built in field, as in PIN diodes, will aid in separating the photo-generated electrons and holes (FIG. 1C) and improve their µτ products.

EXAMPLE

Sample Preparation

High purity TlBr is used as a starting material although less pure source materials may be adequate. Donor dopants are added as metal bromides and acceptor dopants as thallium chalcogenides (the level of doping is discussed in the doping conditions section). The dopant and TlBr are loaded into a quartz ampoule inside a nitrogen filled glove box to limit the exposure to moisture and air. The loaded ampoule is baked under vacuum at a temperature of 150° C. for 3 hours to remove adsorbed gas and moisture from the surface of the sample and ampoule. Then, the ampoule is sealed under vacuum and placed in a Vertical Bridgman 2-zone furnace. The sample is heated to above the melting temperature in the upper zone and then lowered into the second zone at a temperature just below the melting temperature for large crystal formation. The resulting boule is sectioned into disks approximately 2 cm in diameter and 1 mm thick and lapped and polished. In another process, the TlBr is zone refined using a horizontal bed for several passes in a gas environment containing hydrogen bromide gas. During the latter pass(es) the dopant material is added to the seed end of the boule and refined throughout the boule. The material is then sectioned as previously described. This concludes the fabrication of either an acceptor or donor doped sample.

Next, the ionic junction is formed by one of several methods, similar to those used to form p-n junctions in semiconductor devices. This may include liquid phase epitaxy. For example, a donor doped sample is placed in contact with a melt of acceptor doped TlBr and the acceptor doped TlBr solidifies epitaxially on the cooler donor doped sample, forming the junction. Alternatively, a donor doped single crystal wafer is exposed to a vapor containing acceptor like species at elevated temperatures. These acceptor species adsorb and then diffuse into the wafer. The depth of the junction is controlled by the time and temperature of the procedure. Yet another approach involves depositing a thin layer of material containing the acceptor species onto the surface of the wafer by physical or chemical vapor deposition methods and then heating it up to a temperature at which the dopant diffuses into the crystal at the desired diffusivity. In addition, the nominally donor doped single crystal wafer is exposed to a vapor containing acceptor doped TlBr at elevated temperature. The acceptor doped TlBr vapor deposits onto the wafer as an epitaxial p-type layer, forming the junction. Again, the depth of the junction is controlled by the time and temperature of the procedure. A fourth option can be ion-implanting the acceptor impurity into the surface of the wafer followed by a high temperature annealing process to remove the implantation damage. The depth of the junction is controlled by the implantation accelerating voltage. Other methods used by the semiconductor industry to form semiconductor junctions could also be applied to the formation of ionic junctions. Electrodes may be prepared for example by evaporation of Cr and then Au on either face of the sample and electrical leads of Pd attached to the electrodes with carbon paste. Alternate methods for applying electrodes and different electrode materials would also be acceptable.

Doping Conditions

Analogous to a p-n semiconductor diode, the optimum doping conditions for the ionic n and p type regions requires minimization of the reverse bias current or charge flux ($J_o$) given by $$J_o = qK_s\left[\left(\frac{D_{Tl}}{L_{Tl}N_A}\right) + \left(\frac{D_{Br}}{L_{Br}N_D}\right)\right] \quad (2)$$

where $D_i$ is the diffusivity of vacancy i and $L_i$ is diffusion length which is in part related to the lifetime of the vacancy before recombination with its oppositely charged vacancy. The left term in brackets is due to Tl motion and the right term is due to Br motion. We have previously measured and modeled the conductivity ($\sigma$) in TlBr given by $$\sigma_i = \frac{q^2}{kT}D_i[i] \quad (3)$$

where q, D, and [i] are elementary charge, diffusivity, and concentration of defect i (Tl or Br vacancies). Through doping with known amounts of acceptors or donors, [i] as controlled which allowed the calculation of D for Tl and Br. The result is $D_{Br} \approx 10{,}000\, D_{Tl}$ at room temperature meaning that, in equation 2, if $N_A$ is 1 ppm, $N_D$ should be approximately 10,000 so that both Tl and Br motion contribute equally to the current. Our previous research found that the solubility of Se and S acceptors ($N_A$) is low in TlBr (<1 ppm) and that the maximum solubility of Pb donor ($N_D$) appears to be on the order of 100 ppm. In this example, we suggest doping with 1 ppm acceptor and 100 ppm donor which will result in a larger contribution to dark current by Br motion. However, present knowledge attributes long term degradation of TlBr radiation detectors to Tl motion, therefore this doping level is advantageous.

It is recognized that modifications and variations of the invention disclosed herein will be apparent to those of ordinary skill in the art and it is intended that all such modifications and variations be included within the scope of the appended claims.

What is claimed is:

1. Ionic junction comprising: An ionically bonded wide band gap material, wherein the ionically bonded wide band gap material is TlBr, having a first doped region dominated by positively charged ionic defects in physical contact at an interface with a second doped region dominated by negatively charged ionic defects forming depleted regions on both sides of the interface resulting in a built-in electric field.

2. The ionic junction of claim 1 in which the positively charged ionic defects are anion vacancies and the negatively charged ionic defects are cation vacancies.

3. The ionic junction of claim 1 wherein the first region is doped with an acceptor material.

4. The ionic junction of claim 3 wherein the acceptor material is a thallium chalcogenide.

5. The ionic junction of claim 1 wherein the second region is doped with a donor material.

6. The ionic junction of claim 5 wherein the donor material is lead bromide.

7. The ionic junction of claim 2 wherein the first region is doped with an acceptor material.

8. The ionic junction of claim 2 wherein the second region is doped with a donor material.

9. Radiation detector comprising: An ionic junction including an ionically bonded wide band gap material, wherein the ionically bonded wide band gap material is TlBr, having a first doped region dominated by positively charged ionic defects in physical contact at an interface with a second doped region dominated by negatively charged ionic defects forming depleted regions on both sides of the junction resulting in a built-in electric field; and circuit means for establishing a voltage across the junction whereby radiation impinging upon the interface will cause a current to flow in the circuit.

10. The radiation detector of claim 9 wherein the first region is doped with an acceptor material.

11. The radiation detector of claim 10 wherein the acceptor material is a thallium chalcogenide.

12. The radiation detector of claim 9 wherein the second region is doped with a donor material.

13. The radiation detector of claim 12 wherein the donor material is lead bromide.

* * * * *